United States Patent
Choo et al.

(10) Patent No.: US 8,860,032 B2
(45) Date of Patent: Oct. 14, 2014

(54) THIN FILM TRANSISTOR SUBSTRATE, METHOD OF MANUFACTURING THE SAME, AND DISPLAY APPARATUS HAVING THE SAME WHICH IMPROVE SWITCHING CHARACTERISTICS

(75) Inventors: Byoung-Kwon Choo, Hwaseong-si (KR); Joon-Hoo Choi, Seoul (KR); Kyu-Sik Cho, Suwon-si (KR); Seung-Kyu Park, Hwaseong-si (KR); Yong-Hwan Park, Seoul (KR); Sang-Ho Moon, Seoul (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 697 days.

(21) Appl. No.: 12/466,100

(22) Filed: May 14, 2009

(65) Prior Publication Data

US 2010/0096638 A1    Apr. 22, 2010

(30) Foreign Application Priority Data

Oct. 21, 2008 (KR) ........................ 10-2008-0102970

(51) Int. Cl.
*H01L 27/14* (2006.01)
*H01L 27/12* (2006.01)
*H01L 29/786* (2006.01)

(52) U.S. Cl.
CPC ............. *H01L 27/124* (2013.01); *H01L 29/786* (2013.01); *H01L 27/1296* (2013.01)
USPC ......... 257/66; 257/72; 257/E51.005; 438/149

(58) Field of Classification Search
CPC .................................................... H01L 29/786
USPC ..................... 257/66, 72, E51.005; 438/149
See application file for complete search history.

(56) References Cited

U.S. PATENT DOCUMENTS

| 5,990,542 A * | 11/1999 | Yamazaki ...................... 257/642 |
| 6,414,738 B1 * | 7/2002 | Fujikawa ....................... 349/147 |
| 6,436,740 B1 * | 8/2002 | Jen et al. ........................ 438/149 |
| 7,336,031 B2 * | 2/2008 | Chung et al. ................... 313/506 |
| 7,700,954 B2 * | 4/2010 | Noguchi et al. ................. 257/79 |

(Continued)

FOREIGN PATENT DOCUMENTS

| JP | 05-251700 | 9/1993 |
| JP | 2003-035911 | 2/2003 |

(Continued)

*Primary Examiner* — Kimberly Rizkallah
*Assistant Examiner* — Alexander Belousov
(74) *Attorney, Agent, or Firm* — F. Chau & Associates, LLC

(57) ABSTRACT

A thin film transistor substrate that includes a substrate, first and second gate electrodes that are formed on the substrate, a gate insulating layer that is formed on the first and second gate electrodes, a first semiconductor and a second semiconductor that are formed on the gate insulating layer, and that overlap the first gate electrode and the second gate electrode, respectively, a first source electrode and a first drain electrode that are formed on the first semiconductor, and positioned opposed to and spaced from each other, a source electrode connected to the first drain electrode and a second drain electrode positioned opposed to and spaced from the second source electrode, wherein the second source and second drain electrodes are formed on the second semiconductor, and a pixel electrode that is electrically connected to the second drain electrode, a method of manufacturing the same, and a display apparatus having the same.

15 Claims, 18 Drawing Sheets

(56) References Cited

U.S. PATENT DOCUMENTS

| | | | |
|---|---|---|---|
| 7,851,279 B2* | 12/2010 | Takano et al. | 438/155 |
| 2001/0055828 A1* | 12/2001 | Kaneko et al. | 438/34 |
| 2002/0113916 A1 | 8/2002 | Hashiguchi et al. | |
| 2004/0095298 A1* | 5/2004 | Miyazawa | 345/76 |
| 2004/0246209 A1* | 12/2004 | Sung | 345/76 |
| 2006/0071211 A1* | 4/2006 | Lee | 257/59 |
| 2006/0268212 A1* | 11/2006 | Someya et al. | 349/144 |
| 2006/0290828 A1* | 12/2006 | Hwang et al. | 349/43 |
| 2007/0008443 A1* | 1/2007 | Seo et al. | 349/43 |
| 2007/0152223 A1* | 7/2007 | Kang et al. | 257/72 |

FOREIGN PATENT DOCUMENTS

| | | |
|---|---|---|
| JP | 2003-229578 | 8/2003 |
| JP | 2007-148446 | 6/2007 |
| JP | 2007-266252 | 10/2007 |
| JP | 2008-039876 | 2/2008 |
| KR | 1019980020264 | 6/1998 |
| KR | 1020030038837 | 5/2003 |
| KR | 1020060098981 | 9/2006 |
| KR | 1020070043614 | 4/2007 |

* cited by examiner

THIN FILM TRANSISTOR SUBSTRATE, METHOD OF MANUFACTURING THE SAME, AND DISPLAY APPARATUS HAVING THE SAME WHICH IMPROVE SWITCHING CHARACTERISTICS

CROSS-REFERENCE TO RELATED APPLICATION

This application claims priority to and the benefit of Korean Patent Application No. 10-2008-0102970 filed in the Korean Intellectual Property Office on Oct. 21, 2008, the entire contents of which are incorporated herein by reference.

BACKGROUND OF THE INVENTION (a) Technical Field

The present disclosure relates to a thin film transistor substrate, a method of manufacturing the same, and a display apparatus having the same.

(b) Discussion of the Related Art

A thin film transistor substrate includes a plurality of thin film transistors formed on a substrate. Thin film transistors switch signals provided through wires that are disposed on the substrate and control image signals to display images.

In general, the thin film transistors include a gate electrode, a source electrode, a drain electrode, and a semiconductor defining a channel region. The thin film transistors have different switching characteristics depending on a gap between the source electrode and drain electrode, and the gate electrode.

However, the different gaps between the source electrode and drain electrode, and the gate electrode may cause difficulty in displaying accurate images.

SUMMARY OF THE INVENTION

Exemplary embodiments of the present invention provide a thin film transistor substrate, a method of manufacturing the same, and a display apparatus having the same which improve a deviation of switching characteristics.

A thin film transistor substrate, according to an exemplary embodiment of the present invention, includes a substrate, first and second gate electrodes that are formed on the substrate, a gate insulating layer that is formed on the first and second gate electrodes, a first semiconductor and a second semiconductor that are formed on the gate insulating layer, and that overlap the first gate electrode and the second gate electrode, respectively, a first source electrode and a first drain electrode that are formed on the first semiconductor, and are positioned opposed to and spaced apart from each other, a source electrode connected to the first drain electrode and a second drain electrode positioned opposed to and spaced apart from the second source electrode, wherein the second source and second drain electrodes are formed on the second semiconductor, and a pixel electrode that is electrically connected to the second drain electrode.

The first semiconductor and the second semiconductor may further include an etch stopping layer respectively formed thereon. The first semiconductor and the second semiconductor may be formed of polycrystalline silicon.

Portions of the first source electrode and first drain electrode may overlap the etch stopping layer formed on the first semiconductor, and portions of the second source electrode and the second drain electrode may overlap the etch stopping layer formed on the second semiconductor.

Portions of the first source electrode and the first drain electrode may overlap the first gate electrode, and portions of the second source electrode and the second drain electrode may overlap the second gate electrode.

The first source electrode and the first drain electrode may be spaced apart from the first gate electrode by a predetermined gap when the first source electrode and the first drain electrode are projected on the same plane as the first gate electrode, and the second source electrode and the second drain electrode may be spaced apart from the second gate electrode by a predetermined gap when the second source electrode and the second drain electrode are projected on the same plane as the second gate electrode.

The thin film transistor substrate may further include ohmic contact layers that are formed between the first source electrode and first drain electrode, and the first semiconductor, and between the second source electrode and second drain electrode, and the second semiconductor.

The ohmic contact layers may have the same planar shape as the first source and first drain electrodes, and the second source and second drain electrodes.

The positional relationship of the first source electrode and the first drain electrode with respect to the first gate electrode may be opposite to the positional relationship of the second source electrode and the second drain electrode with respect to the second gate electrode.

The first and second gate electrodes, the first and second source electrodes, and the first and second drain electrodes may be positioned along the substrate in the order of the first source electrode, the first gate electrode, the first drain electrode, the second drain electrode, the second gate electrode, and the second source electrode.

An organic light emitting display apparatus, according to an embodiment of the present invention, includes a substrate, first and second gate electrodes that are formed on the substrate, a gate insulating layer that is formed on the first and second gate electrodes, a first semiconductor and a second semiconductor that are formed on the gate insulating layer, and that overlap the first gate electrode and the second gate electrode, respectively, a first source electrode and a first drain electrode that are formed on the first semiconductor, and are positioned opposed to and spaced apart from each other, a source electrode connected to the first drain electrode and a second drain electrode positioned opposed to and spaced apart from the second source electrode, wherein the second source and second drain electrodes are formed on the second semiconductor, a driving transistor that is electrically connected to the second drain electrode, and a pixel electrode that is electrically connected to the driving transistor.

The positional relationship of the first source electrode and the first drain electrode with respect to the first gate electrode may be opposite to the positional relationship of the second source electrode and the second drain electrode with respect to the second gate electrode.

The first and second gate electrodes, the first and second source electrodes, and the first and second drain electrodes may be positioned along the substrate in the order of the first source electrode, the first gate electrode, the first drain electrode, the second drain electrode, the second gate electrode, and the second source electrode.

A method of manufacturing a thin film transistor substrate, according to an embodiment of the present invention, includes forming first and second gate electrodes on a substrate, forming a gate insulating layer on the first gate electrode and the second gate electrode, forming a first semiconductor and a second semiconductor that correspond to the first gate electrode and the second gate electrode, respectively, on the gate insulating layer, forming a first source electrode and a first drain electrode on the first semiconductor, forming a second source electrode connected to the first drain electrode on a second semiconductor, and forming a second drain electrode positioned opposed to the second source electrode on the second semiconductor, and forming a pixel electrode electrically connected to the second drain electrode.

The method may further include forming an etch stopping layer on the first semiconductor and the second semiconductor, respectively.

The method may further include forming ohmic contact layers between the first source electrode and first drain electrode, and the first semiconductor, and between the second source electrode and second drain electrode, and the second semiconductor.

The ohmic contact layers, the first source electrode, the second source electrode, the first drain electrode, and the second drain electrode may be formed by the same photolithography process.

The positional relationship of the first source electrode and the first drain electrode with respect to the first gate electrode may be opposite to the positional relationship of the second source electrode and the second drain electrode with respect to the second gate electrode.

The first and second gate electrodes, the first and second source electrodes, and the first and second drain electrodes may be positioned along the substrate in the order of the first source electrode, the first gate electrode, the first drain electrode, the second drain electrode, the second gate electrode, and the second source electrode.

According to exemplary embodiments of the present invention, it is possible to improve the deviation of switching characteristics of thin film transistors used for a display apparatus.

BRIEF DESCRIPTION OF THE DRAWINGS

Exemplary embodiments of the present invention can be understood in more detail from the following descriptions taken in conjunction with the accompanying drawings in which.

DETAILED DESCRIPTION OF THE EMBODIMENTS

Figure 1:
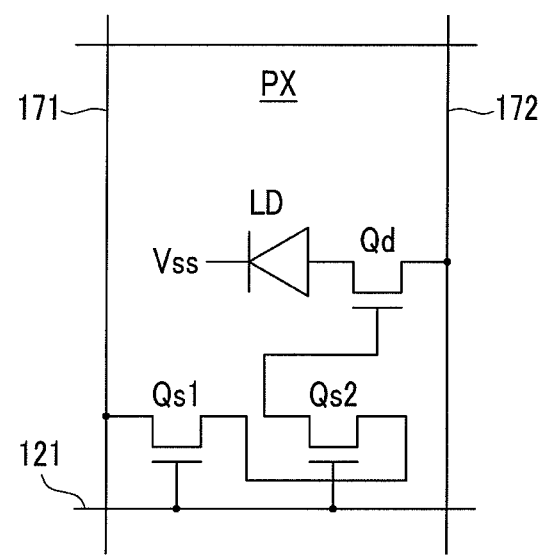
FIG. 1 is an equivalent circuit diagram of one pixel in an organic light emitting display apparatus according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on" another element, it can be directly on the other element or intervening elements may also be present.

An organic light emitting display apparatus including a thin film transistor substrate according to an exemplary embodiment of the present invention will be described in detail with reference to FIG. 1.

FIG. 1 is an equivalent circuit diagram of an organic light emitting display apparatus according to an exemplary embodiment of the present invention.

Referring to FIG. 1, the organic light emitting display apparatus according to the exemplary embodiment of the present invention includes a plurality of signal lines 121, 171, and 172, and a plurality of pixels PX that are connected to the signal lines and are arranged substantially in a matrix.

The signal lines include a plurality of gate lines 121 that transmit gate signals (or scanning signals), a plurality of data lines 171 that transmit data signals, and a plurality of driving voltage lines 172 that transmit driving voltages. The gate lines 121 extend substantially in a row direction and are substantially parallel to each other, and the data lines 171 and the driving voltage lines 172 extend substantially in a column direction and are substantially parallel to each other.

Each of the pixels PX includes two switching transistors Qs1 and Qs2, a driving transistor Qd, and an organic light emitting diode (OLED) LD.

Each of the switching transistors Qs1 and Qs2 includes a control terminal, an input terminal, and an output terminal. The control terminal of the first switching transistor Qs1 is connected to the gate line 121, the input terminal thereof is connected to the data line 171, and the output terminal thereof is connected to the second switching transistor Qs2. The control terminal of the second switching transistor Qs2 is connected to the gate line 121 and the output terminal thereof is connected to the driving transistor Qd. The switching transistors Qs1 and Qs2 transmit a data signal applied to the data line 171 to the driving transistor Qd in response to a scanning signal applied to the gate line 121.

The driving transistor Qd also includes a control terminal, an input terminal, and an output terminal. The control terminal of the driving transistor Qd is connected to the output terminal of the second switching transistor Qs2, the input terminal thereof is connected to the driving voltage line 172, and the output terminal thereof is connected to the organic light emitting diode LD. The driving transistor Qd allows an output current ILD to flow. The intensity of the output current ILD varies depending on a voltage between the control terminal and the output terminal of the driving transistor Qd.

The organic light emitting diode LD includes an anode that is connected to the output terminal of the driving transistor Qd and a cathode that is connected to a common voltage Vss. The organic light emitting diode LD emits light at different intensities depending on the output current ILD of the driving transistor Qd to display images.

The switching transistors Qs1 and Qs2 and the driving transistor Qd are n-channel field effect transistors (FETs). However, at least one of the switching transistors Qs1 and Qs2 and the driving transistor Qd may be a p-channel field effect transistor. Further, connection relationships of the transistors Qs1, Qs2, and Qd and the organic light emitting diode LD may be changed.

Next, the organic light emitting display apparatus shown in FIG. 1 will be described in further detail with reference to FIGS. 2 and 3.

Figure 2:
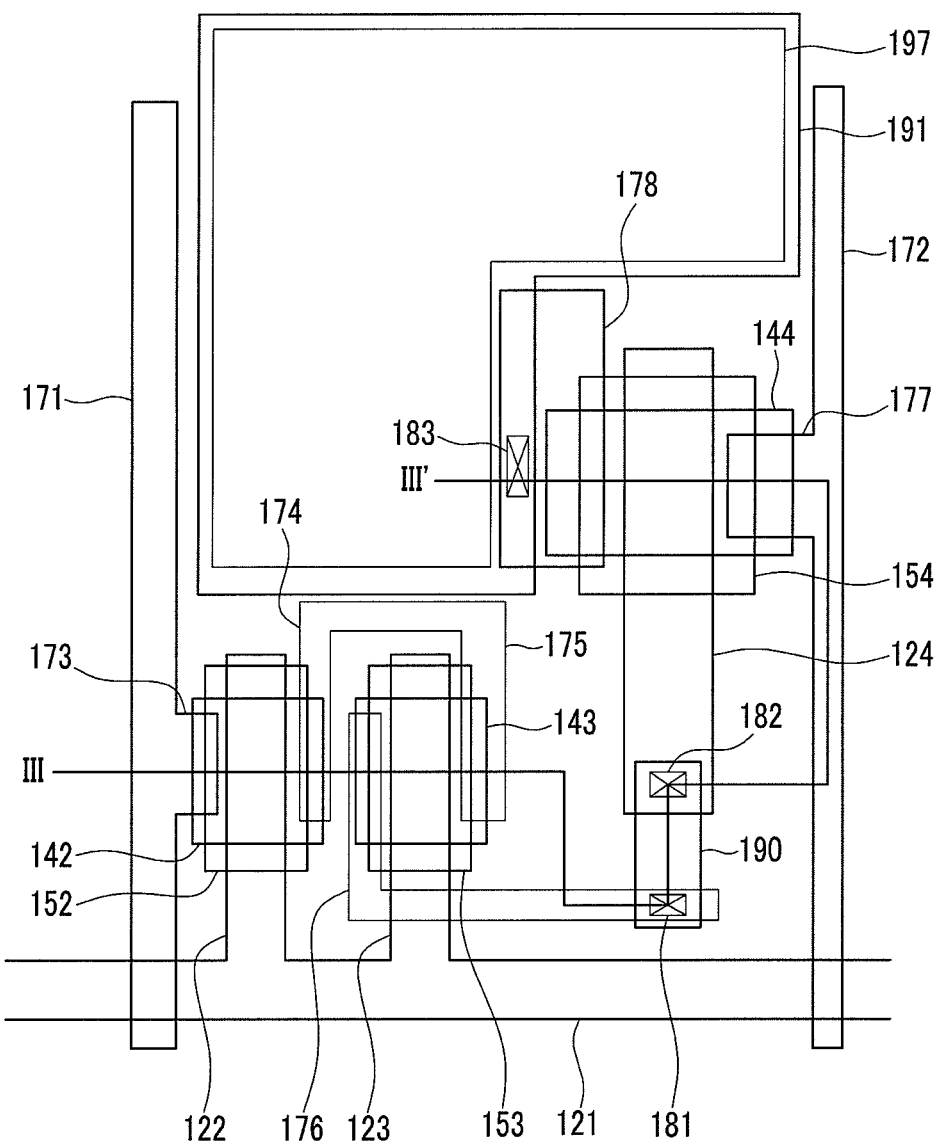
FIG. 2 is a layout view of an organic light emitting display apparatus according to an exemplary embodiment of the present invention.
Figure 3:
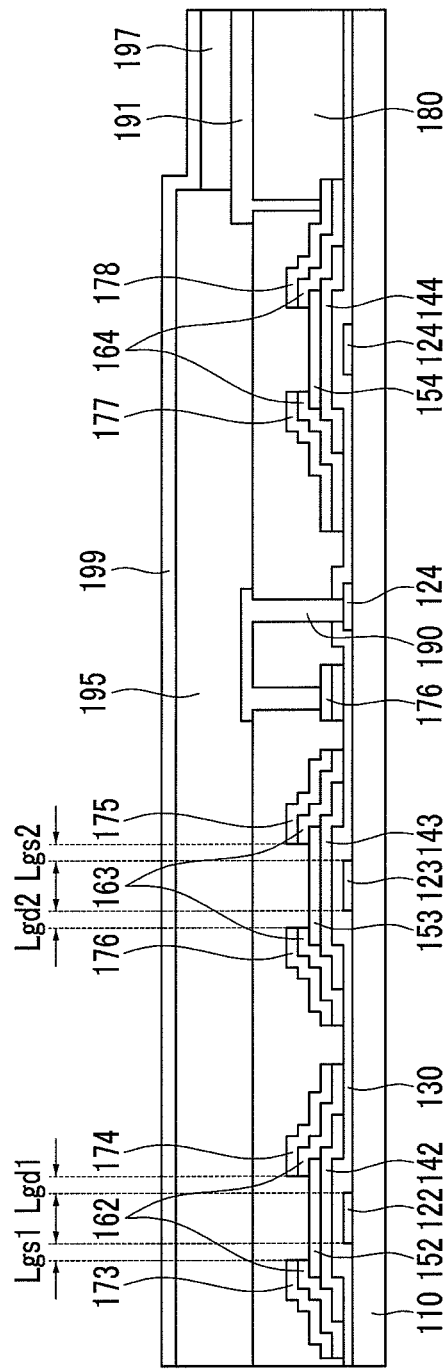
FIG. 3 is a cross-sectional view of the organic light emitting display apparatus taken along line III-III' in FIG. 2.

FIG. 2 is a layout view of an organic light emitting display apparatus according to an exemplary embodiment of the present invention, and FIG. 3 is a cross-sectional view of the organic light emitting display apparatus taken along line III-III' in FIG. 2.

The plurality of gate lines 121, including a first gate electrode 122, a second gate electrode 123, and a driving gate electrode 124, are formed on an insulation substrate 110 that is made of transparent glass or plastic.

The gate lines 121 transmit gate signals and extend substantially in a horizontal direction. Each of the gate lines 121 includes a first pad portion (not shown) having a large area for contact with another layer or an external driving circuit. The first gate electrode 122 and the second gate electrode 123 extend from the gate line 121, for example in an upward direction as shown in FIG. 2.

The gate line 121 may be made of an aluminum (Al)-containing metal such as Al or an Al alloy, a Ag-containing metal such as Ag or an Ag alloy, a Cu-containing metal such as Cu and a Cu alloy, a Mo-containing metal such as Mo and a Mo alloy, Cr, Ta, or Ti. According to an embodiment, the gate lines 121 may have a multi-layered structure including two conductive films (not shown) having different physical characteristics.

The lateral sides of the gate lines 121 are inclined with respect to the surface of the substrate 110. The inclination angles thereof may be in the range of about 30 to about 80 degrees.

A gate insulating layer 130 that is made of silicon nitride (SiNx) and silicon oxide (SiOx) is formed on the gate lines 121.

A first semiconductor 142, a second semiconductor 143, and a driving semiconductor 144 that correspond to the first gate electrode 122, the second gate electrode 123, and the driving gate electrode 124, respectively, are formed on the gate insulating layer 130. The first semiconductor 142, the second semiconductor 143, and the driving semiconductor 144 are made of, for example, microcrystalline silicon or polycrystalline silicon.

A first etch stopping layer 152, a second etch stopping layer 153, and a driving etch stopping layer 154 are formed on the first semiconductor 142, the second semiconductor 143, and the driving semiconductor 144, respectively. The etch stopping layers include an insulating material such as silicon nitride or silicon, and have thicknesses of about 100 Å to about 3000 Å. The etch stopping layers 152, 153, and 154 can prevent the semiconductors 142, 143, and 144 from being over-etched when other thin layers are formed on the semiconductors 142, 143, and 144, thereby protecting a channel region.

A pair of first ohmic contact layers 162, a pair of second ohmic contact layers 163, and a pair of driving ohmic contact layers 164 are formed on the etch stopping layers 152, 153, and 154, respectively. The ohmic contact layers 162, 163, and 164 may be made of n+ hydrogenated amorphous silicon or microcrystalline silicon heavily doped with an n-type impurity such as phosphorous (P).

A plurality of data conductors that include a plurality of data lines 171, a plurality of driving voltage lines 172 and a first source electrode 173, a first drain electrode 174, a second source electrode 175, a second drain electrode 176, a driving source electrode 177, and a driving drain electrode 178 are formed on the ohmic contact layers 162, 163, and 164 and the gate insulating layer 130.

The data lines 171 transmit data signals and extend substantially in a vertical direction to intersect the gate lines 121. Each of the data lines 171 includes the plurality of first source electrodes that extend toward the first gate electrodes 122, and a second pad portion (not shown) having a large area for contact with another layer or an external driving circuit.

The driving voltage lines 172 transmit the driving voltages and extend substantially in the vertical direction to intersect the gate lines 121. Each of the driving voltage lines 172 includes the plurality of driving source electrodes 177 extending therefrom.

The first drain electrode 174, the second drain electrode 176, and the driving drain electrode 178 are separated from one another, and are also separated from the data lines 171 and the driving voltage lines 172. The first source electrode 173 and the first drain electrode 174 are positioned to be opposed to each other with respect to the first semiconductor 142, the second source electrode 175 and the second drain electrode 176 are positioned to be opposed to each other with respect to the second semiconductor 143, and the driving source electrode 177 and the driving drain electrode 178 are positioned to be opposed to each other with respect to the driving semiconductor 144.

The first drain electrode 174 is connected to the second source electrode 175 and transmits the data signals input through the first source electrode 173 to the second semiconductor 143.

The data conductors may be made of a low-resistivity metal such as Al, Cu, Ag, or alloys thereof, or a refractory metal such as Cr, Mo, Ta, Ti, or alloys thereof. The data conductors may have a multi-layered structure including a refractory metal film (not shown) and a low-resistivity film (not shown).

Similar to the gate lines 121, the lateral sides of the data conductors may be inclined with respect to the surface of the substrate 110 at an inclination angle of about 30 to about 80 degrees.

Interlayer insulating layers 180 that are made of, for example, silicon nitride or silicon oxide are formed on the data conductors, exposed portions of the semiconductors 142, 143, and 144, the etch stopping layers 152, 153, and 154, and the gate insulating layer 130.

A plurality of contact holes 181, 182, and 183 that expose the second drain electrode 176, the driving gate electrode 124, and the driving drain electrode 178, respectively, are formed on the interlayer insulating layers 180.

The driving gate electrode 124 is connected to the second drain electrode 176 through the contact holes 181 and 182.

The driving gate electrode 124 may be made of the same material as the gate lines 121.

The interlayer insulating layers 180 are formed with thicknesses that are sufficient to flatten regions where the switching transistor Qs and the driving transistor Qd are formed. According to an embodiment, the interlayer insulating layers 180 may be made of one material selected from a group composed of a polyimide, a benzocyclobutene series resin, and an acrylate.

A pixel electrode 191 and a plurality of contact assistants 190 are formed on the interlayer insulating layers 180.

The pixel electrode 191 may be made of a transparent metallic material such as indium tin oxide (ITO), indium zinc oxide (IZO), or the like.

The contact assistants 190 are connected to the second drain electrode 176 and the driving gate electrode 124 through the contact holes 181 and 182. The contact assistants 190 transmit the data signals to the driving gate electrode 124 of a driving thin film transistor.

Partitions 195 are disposed on the pixel electrode 191 and the interlayer insulating layers 180. The partitions 195 surround the periphery of the pixel electrode 191, like a bank, to define an opening.

The partitions 195 may be made of an organic insulating material having heat resistance and solvent resistance, such as an acrylic resin, a polyimide resin, and the like, or an inorganic insulating material such as silicon oxide ($SiO_2$), titanium oxide ($TiO_2$), or the like. The partitions 195 may have a structure of two layers or more. The partitions 195 may also be made of a photosensitive material containing a black pigment. According to an embodiment, the partitions 195 may function as a light shielding member and a process of manufacturing the same is relatively simple.

An organic light emitting member 197 is formed in the opening on the pixel electrode 191 defined by the partition 195.

The organic light emitting member 197 may have a multi-layered structure including a light emitting layer (not shown) that emits the light and an auxiliary layer (not shown) for improving emission efficiency of the light emitting layer.

The light emitting layer is made of, for example, an organic material that emits light of primary colors such as red, green, and blue, or a mixture of the organic material and an inorganic material, and may contain a polyfluorene derivative, a (poly) paraphenylenevinylene derivative, a polyphenylene derivative, a polyfluorene derivative, polyvinylcarbazole, a polythiophene derivative, or compounds in which polymer materials thereof are doped with a perylene-family pigment, a cumarine-family pigment, a rhodamine-family pigment, rubrene, perylene, 9,10-diphenylanthracene, tetraphenylbutadiene, Nile red, coumarin, quinacridone, etc. The organic light emitting display apparatus displays a desired image by spatially synthesizing primary colored light emitted from the light emitting layer.

The auxiliary layer includes an electron transport layer (not shown) and a hole transport layer (not shown) for balancing electrons and holes, and an electron injecting layer (not shown) and a hole injecting layer (not shown) for enforcing injection of the electrons and the holes. The hole transport layer and the hole injecting layer are made of, for example, a material having an intermediate work function between the pixel electrode 191 and the light emitting layer, and the electron transport layer and the electron injecting layer are made of, for example, a material with an intermediate work function between a common electrode 199 and the light emitting layer. For example, as the hole transport layer or the hole injecting layer, a mixture of polyethylenedioxythiophene (PEDOT) and polystyrenesulfonate (PSS), may be used.

The common electrode 199 is disposed on the organic light emitting member 197 and the partition 195. The common electrode 199 is formed on the entire surface of the substrate 110, and is paired with the pixel electrode 191 to allow a current to flow on the organic light emitting member 197.

A switching thin film transistor of the organic light emitting display apparatus has different switching characteristics depending on a gap Lgs between a gate electrode and a source electrode thereof and a gap Lgd between the gate electrode and a drain electrode thereof.

Figure 16A:
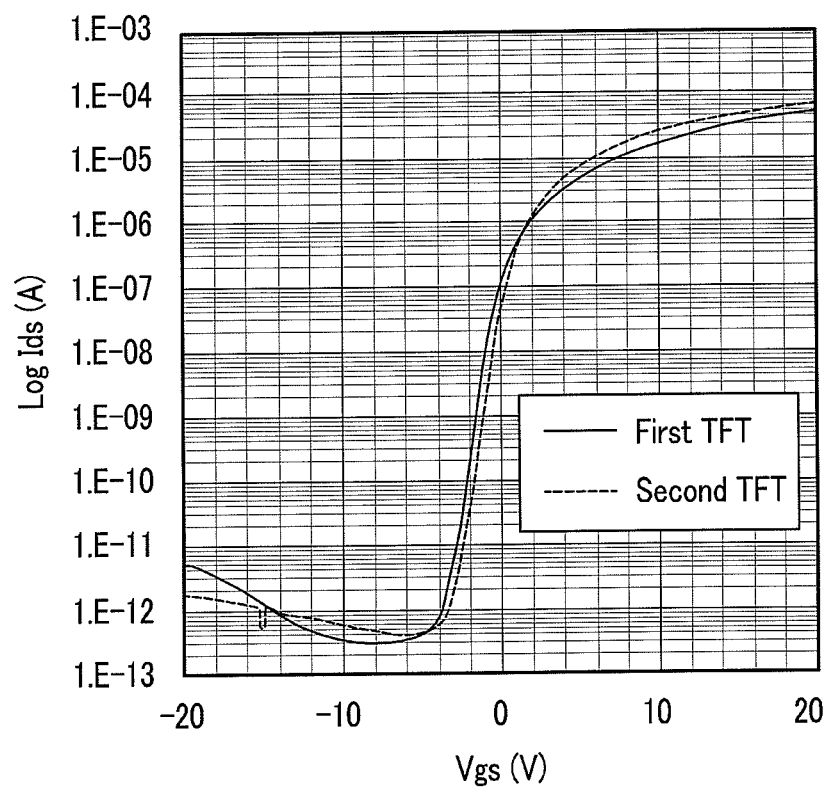
FIG. 16A is a graph illustrating switching characteristics of two TFTs (a first TFT and a second TFT) that have of the same Lgs and Lgd values.
Figure 16B:
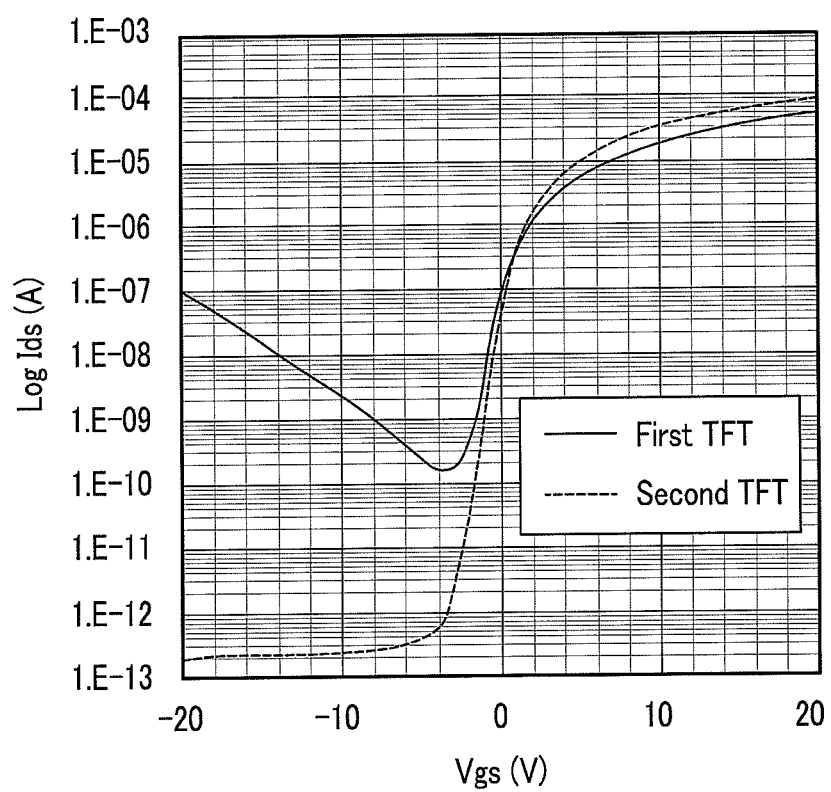
FIG. 16B is a graph illustrating switching characteristics of two TFTs (a third TFT and a fourth TFT) that have different Lgs and Lgd values.

Referring to FIGS. 16A and 16B, FIG. 16A is a graph illustrating switching characteristics of two TFTs (a first TFT and a second TFT) that have the same Lgs and Lgd values, and FIG. 16B is a graph illustrating switching characteristics of two TFTs (a third TFT and a fourth TFT) that have different Lgs and Lgd values.

As shown in FIGS. 16A and 16B, the characteristics of the TFTs depend, at least in part, on the differences between the values of Lgs and Lgd.

The thin film transistor substrate according to an exemplary embodiment of the present invention, which is shown in FIGS. 2 and 3, includes two switching transistors Qs1 and Qs2. The first drain electrode 174 of the first switching transistor Qs1 is connected to the second source electrode 175 of the second switching transistor Qs2. In such a structure, Lgs1 at the first switching transistor Qs1 and Lgs2 at the second switching transistor Qs2 have compensatory relationships with each other and Lgd1 at the first switching transistor Qs1 and Lgd2 at the second switching transistor Qs2 have compensatory relationships with each other. As a result, the values of Lgs and Lgd of the switching transistors Qs1 and Qs2 have a predetermined ratio, thereby securing uniformity of the switching characteristics.

Relative positions of the source electrodes 173 and 175 and the drain electrodes 174 and 176 with respect to the gate electrodes 122 and 123 may be changed due to a mask alignment error in a photolithography process. At this time, when the first source electrode 173 is positioned farther away from the first gate electrode 122, the second source electrode 175 is positioned closer to the second gate electrode 123, and when the first drain electrode 174 is positioned farther away from the first gate electrode 122, the second drain electrode 176 is positioned closer to the second gate electrode 123. As a result, the values of Lgs and Lgd of the switching transistors Qs1 and Qs2 have the predetermined ratio regardless of the alignment error. This is because the positional relationship of the first source electrode 173 and the first drain electrode 174 with respect to the first gate electrode 122 is opposite to the positional relationship of the second source electrode 175 and the second drain electrode 176 with respect to the second gate electrode 123. That is, referring to FIG. 2, the first source electrode 173, the first gate electrode 122, the first drain electrode 174, the second drain electrode 176, the second gate electrode 123, and the second source electrode 175 are arranged in sequence.

The structures of the switching transistors Qs1 and Qs2 are not limited only to the structures shown in FIGS. 2 and 3, and the switching transistors Qs1 and Qs2 may have various structures.

Figure 14A:
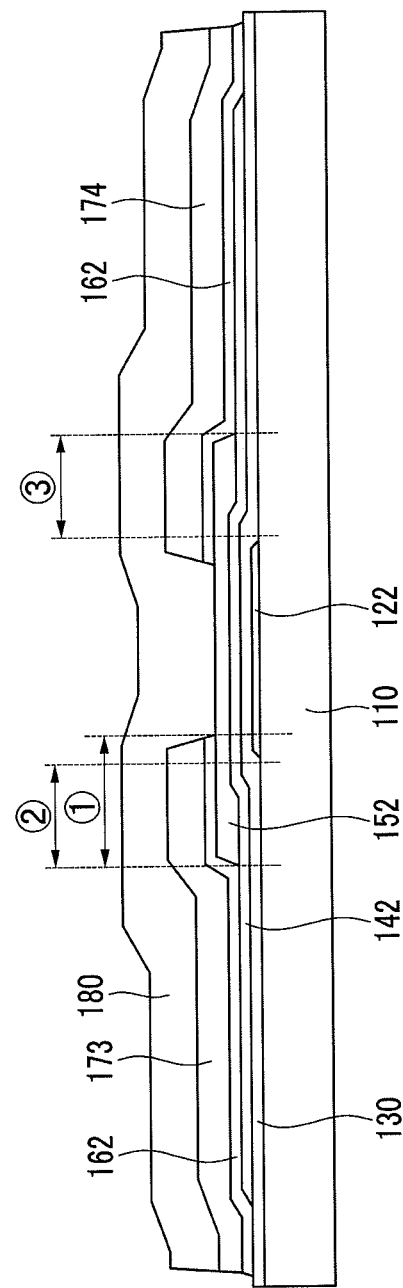
FIGS. 14A and 14B are cross-sectional views of a switching transistor of a thin film transistor substrate according to an embodiment of the present invention.
Figure 14B:
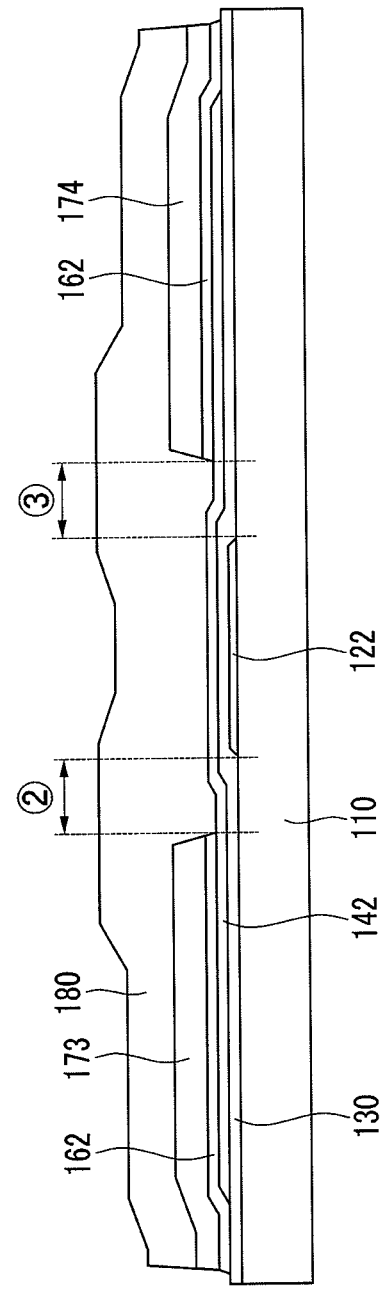

FIGS. 14A and 14B are cross-sectional views of switching transistors of a thin film transistor substrate according to an embodiment of the present invention.

In the embodiment of FIG. 14A, the switching transistor Qs may have a portion where the gate electrode 122, the etch stopping layer 152, the source electrode 173, and the drain electrode 174 are superimposed on each other (as shown, for example, by the numbers 1, 2 and 3). As shown in FIG. 14B, the etch stopping layer 152 may be omitted, and the gate electrode 122 may be planarly spaced (as shown, for example, by the numbers 2 and 3) from the source electrode 173 and the drain electrode 174 by a predetermined gap.

While the above embodiments have been described in connection with the organic light emitting display apparatus, they are not limited thereto, and can be applied to other types of displays, such as, for example, a liquid crystal display.

Figure 15:
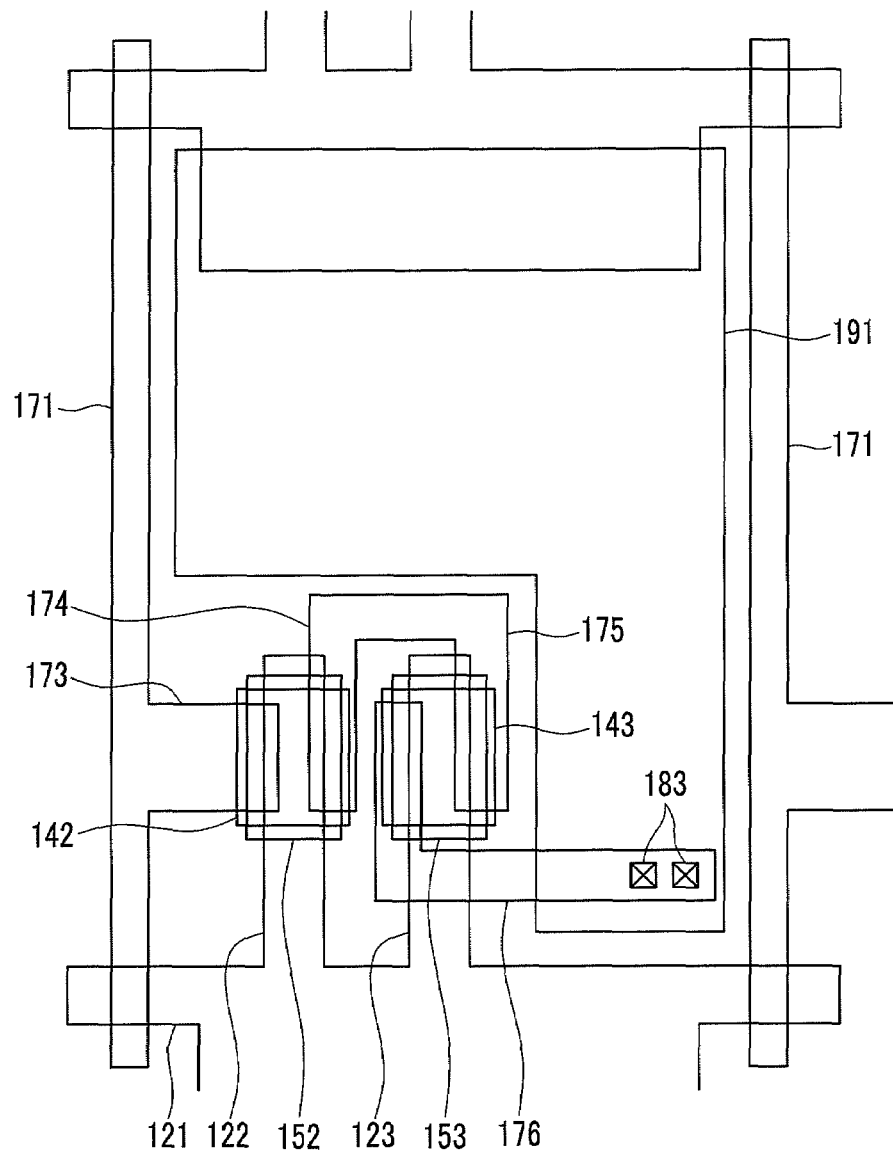
FIG. 15 is a layout view of a thin film transistor substrate included in a liquid crystal display according to an embodiment of the present invention.

FIG. 15 is a layout view of a thin film transistor substrate included in a liquid crystal display according to an embodiment of the present invention.

Referring to FIG. 15, the thin film transistor substrate includes the switching transistors Qs1 and Qs2, and the pixel electrode 191 electrically connected to the switching transistors Qs1 and Qs2. The pixel electrode 191 is electrically connected to the second drain electrode 176 through the contact holes 183.

A method of manufacturing the organic light emitting display apparatus shown in FIGS. 2 and 3 will be described in detail with reference to FIGS. 4 to 13.

Figure 4:
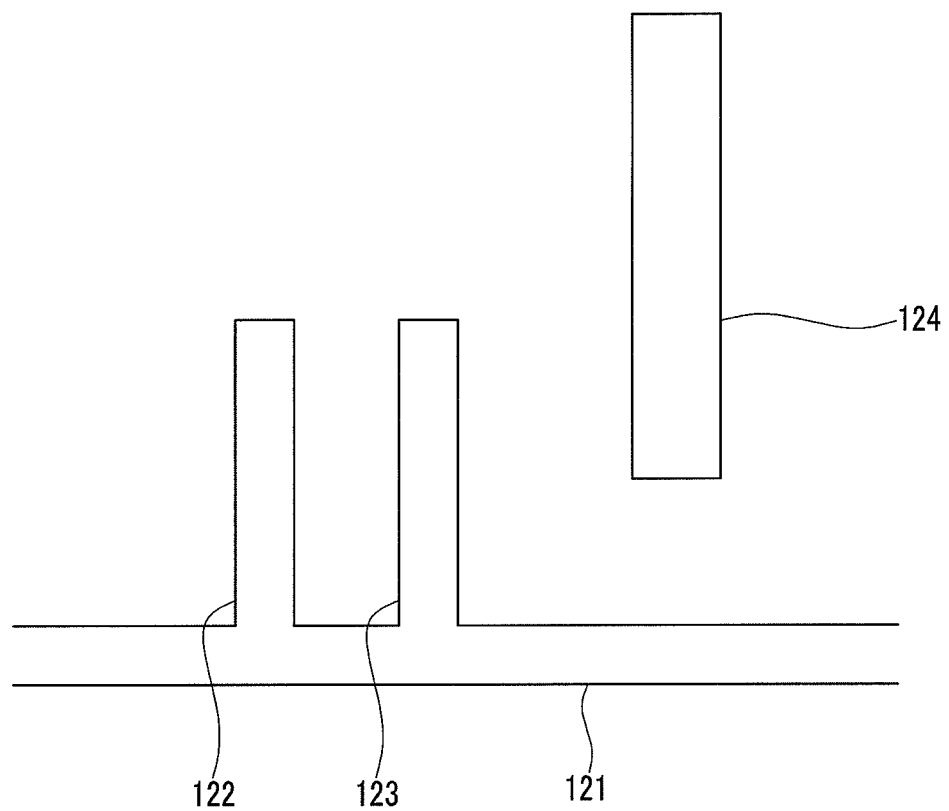
FIGS. 4 to 13 are layout views and cross-sectional views illustrating a method of manufacturing the organic light emitting display apparatus of FIGS. 2 and 3 according to an exemplary embodiment of the present invention.
Figure 5:
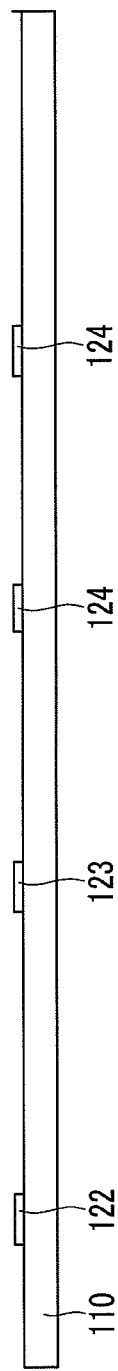

Referring to FIGS. 4 and 5, the first gate electrode 122, the second gate electrode 123, and the driving gate electrode 124 are formed on the substrate 110. More specifically, the first gate electrode 122, the second gate electrode 123, and the driving gate electrode 124 are formed by patterning a gate conductive film (not shown) after forming the gate conductive film on the substrate 110.

Figure 6:
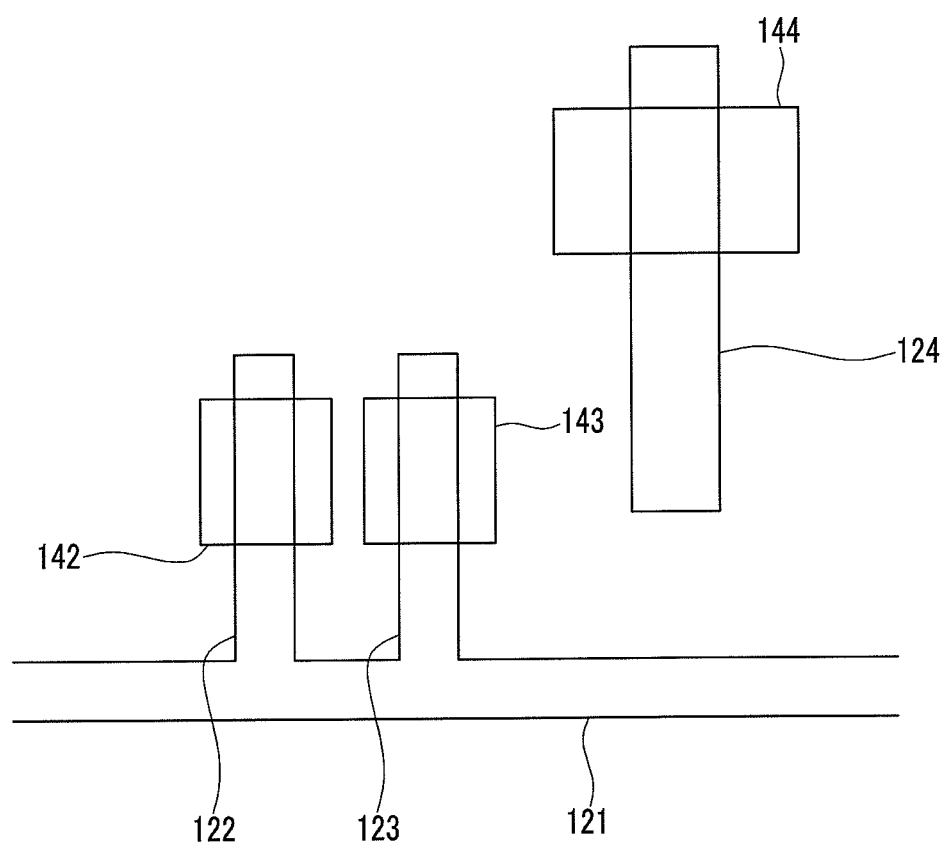
Figure 7:
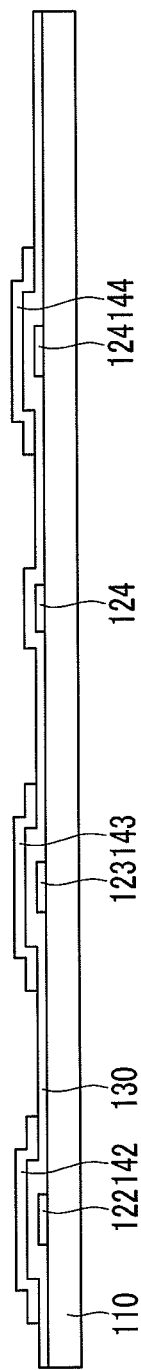

Referring to FIGS. 6 and 7, the gate insulating layer 130 and a semiconductor layer are sequentially formed on the first gate electrode 122, the second gate electrode 123, and the driving gate electrode 124. Each of the gate insulating layer 130 and the semiconductor layer may be formed by using a chemical vapor deposition (CVD) process.

Next, the first semiconductor 142, the second semiconductor 143, and the driving semiconductor 144 are formed by patterning the semiconductor layer. The first semiconductor 142, the second semiconductor 143, and the driving semiconductor 144 may be crystallized by using a crystallization method such as excimer laser annealing (ELA), sequential lateral solidification (SLS), or solid phase crystallization (SPC).

Figure 8:
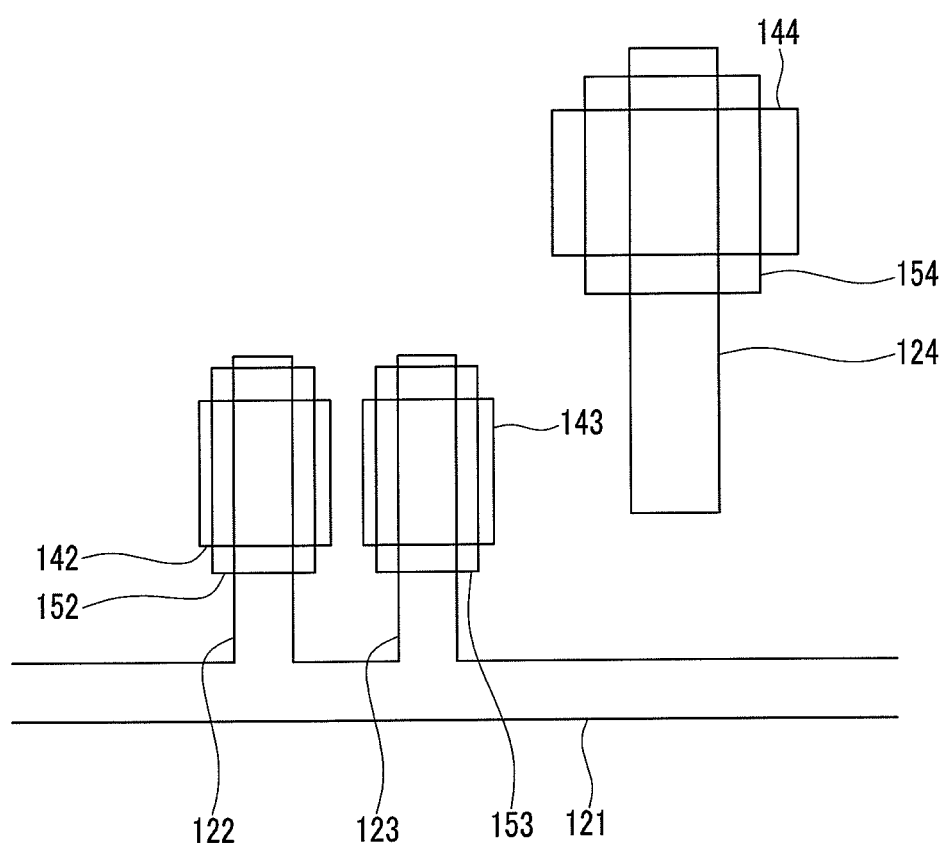
Figure 9:
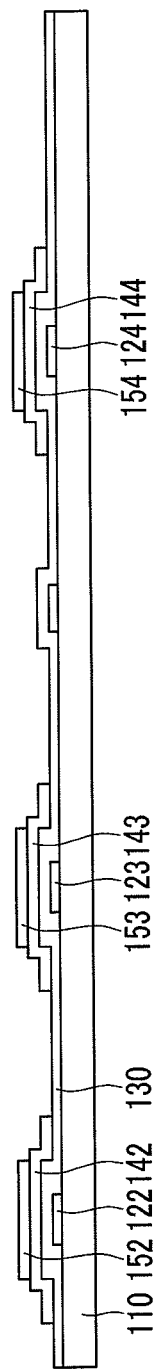

Referring to FIGS. 8 and 9, after a preliminary etch stopping layer (not shown) is formed on the first semiconductor 142, the second semiconductor 143, and the driving semiconductor 144, the first etch stopping layer 152, the second etch stopping layer 153, and the driving etch stopping layer 154 are formed by patterning the preliminary etch stopping layer. The first etch stopping layer 152, the second etch stopping layer 153, and the driving etch stopping layer 154 are formed to correspond to the first semiconductor 142, the second semiconductor 143, and the driving semiconductor 144, respectively. A channel-direction length where the source electrode and the drain electrode will be formed thereafter may be larger than lengths of the first gate electrode 122, the second gate electrode 123, and the driving gate electrode 124.

Figure 10:
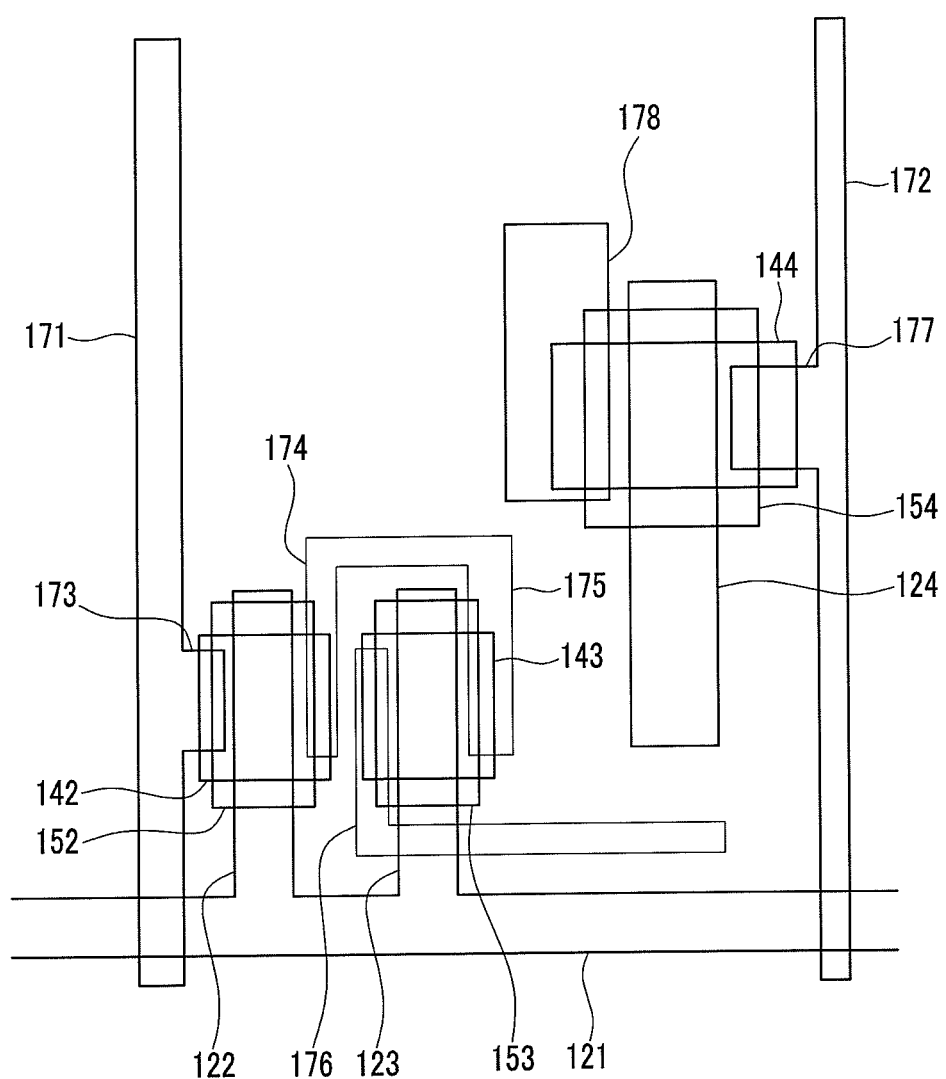
Figure 11:
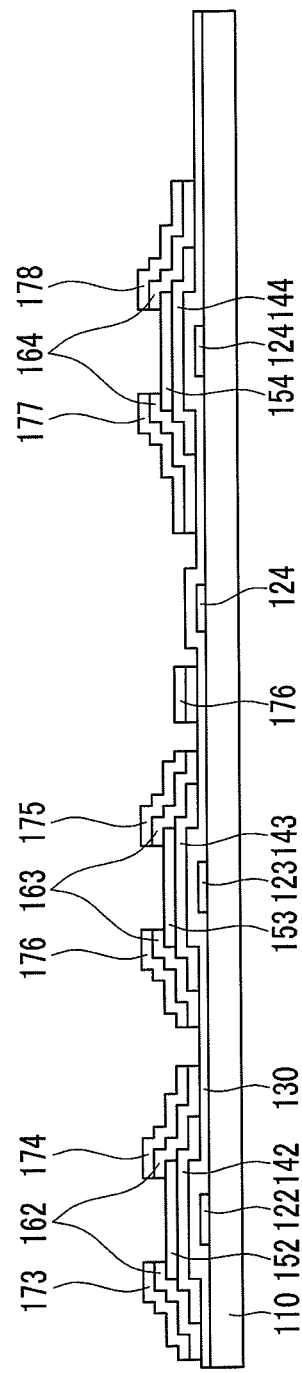

Referring to FIGS. 10 and 11, after an ohmic contact layer (not shown) and a data conductive layer (not shown) are formed on the first etch stopping layer 152, the second etch stopping layer 153, and the driving etch stopping layer 154, the pair of first ohmic contact layers 162, the pair of second ohmic contact layers 163, the pair of driving ohmic contact layers 164, the data line 171, the first source electrode 173, the first drain electrode 174, the second source electrode 175, the second drain electrode 176, the driving voltage line 172, the driving source electrode 177, and the driving drain electrode 178 are formed by patterning the ohmic contact layer and the data conductive layer. The first drain electrode 174 is connected to the second source electrode 175. The ohmic contact layers 162, 163 and 164 and the data conductor patterns 171, 172, 173, 174, 175, 176, 177 and 178 may have the same planar shape.

Figure 12:
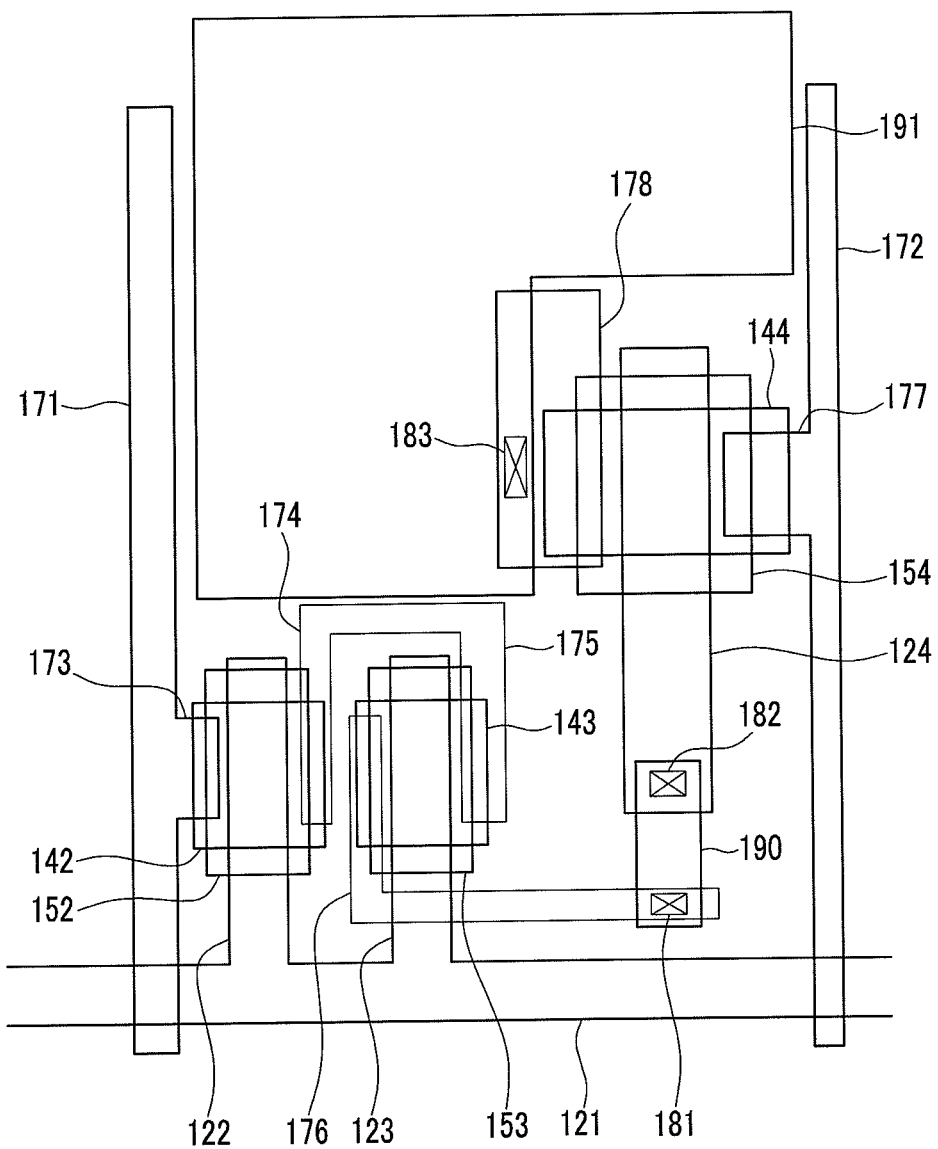
Figure 13:
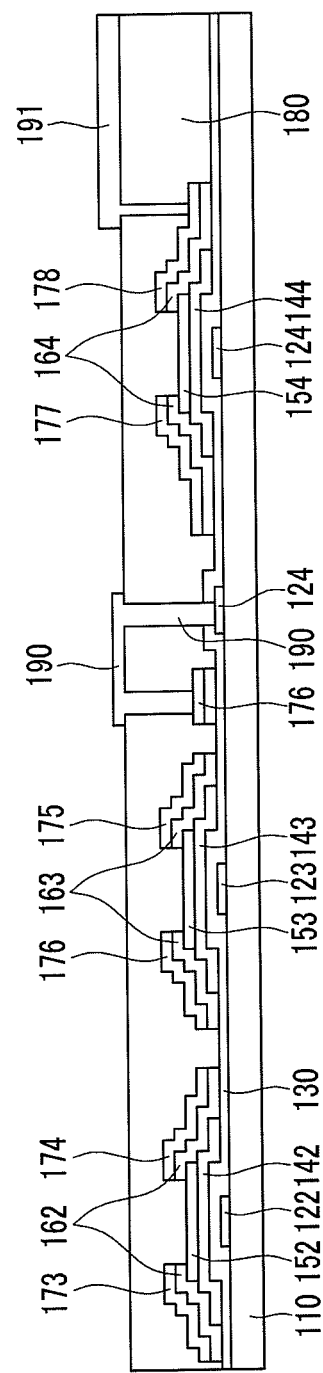

Referring to FIGS. 12 and 13, after an interlayer insulating layer is formed on the data conductor patterns 171, 172, 173, 174, 175, 176, 177 and 178, the interlayer insulating layer 180 and the plurality of contact holes 181 to 183 are formed by patterning the interlayer insulating layer.

Next, after a conductor (not shown) is formed on the interlayer insulating layer 180, the pixel electrode 191 and the contact assistant 190 are formed by patterning the conductor (not shown). The contact assistant 190 electrically connects the second drain electrode 176 with the driving gate electrode 124.

Referring back to FIGS. 2 and 3, the partition 195 having the opening is formed on the pixel electrode 191.

Next, the organic light emitting member 197 is formed in the opening of the partition 195. The organic light emitting member 197 may be formed by a solution process such as an inkjet printing process, etc., or a deposition process. In the case of the inkjet printing process in which a solution is deposited in the opening while moving an inkjet head (not shown), a drying process is performed after forming each of the layers.

Next, the common electrode 199 is formed on the partition 195 and the light emitting member 197.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor substrate, comprising:
   a substrate;
   first and second gate electrodes disposed on the substrate;
   a gate insulating layer disposed on the first and second gate electrodes;
   first semiconductor and a second semiconductor disposed on the gate insulating layer, and overlapping the first gate electrode and the second gate electrode, respectively;
   a first source electrode and a first drain electrode disposed on the first semiconductor, wherein the first source and first drain electrodes are positioned opposed to and spaced apart from each other;
   a second source electrode connected to the first drain electrode and a second drain electrode positioned opposed to and spaced apart from the second source electrode, wherein the second source and second drain electrodes are disposed on the second semiconductor, wherein the second drain electrode is positioned on the substrate adjacent the first drain electrode and between the second source electrode and the first drain electrode; and
   a pixel electrode electrically connected to the second drain electrode,
   wherein the first drain electrode is directly connected to the second source electrode.

2. The thin film transistor substrate of claim 1, further comprising an etch stopping layer disposed on each of the first and second semiconductors.

3. The thin film transistor substrate of claim 2, Wherein the first semiconductor and the second semiconductor are formed of polycrystalline silicon.

4. The thin film transistor substrate of claim 3, wherein portions of the first source electrode and the first drain electrode overlap the etch stopping layer disposed on the first semiconductor and portions of the second drain electrode and second source electrode overlap the etch stopping layer disposed on the second semiconductor.

5. The thin film transistor substrate of claim 4, wherein portions of the first source electrode and the first drain electrode overlap the first gate electrode, and portions of the second source electrode and the second drain electrode overlap the second gate electrode.

6. The thin film transistor substrate of claim 1, wherein the first source electrode and the first drain electrode are spaced apart from the first gate electrode by a predetermined gap in a layout view, and the second source electrode and the second drain electrode are spaced apart from the second gate electrode by a predetermined gap in a layout view.

7. The thin film transistor substrate of claim 1, further comprising ohmic contact layers disposed between the first source electrode and first drain electrode, and the first semiconductor, and between the second source electrode and second drain electrode, and the second semiconductor.

8. The thin film transistor substrate of claim 7, wherein the ohmic contact layers have the same planar shape as the first source electrode and the first drain electrode, and the second source electrode and the second drain electrode.

9. The thin film transistor substrate of claim 1, wherein a positional relationship of the first source electrode and the first drain electrode with respect to the first gate electrode is opposite to a positional relationship of the second source electrode and the second drain electrode with respect to the second gate electrode.

10. The thin film transistor substrate of claim 9, wherein the first and second gate electrodes, the first and second source electrodes, and the first and second drain electrodes are positioned along the substrate in the order of the first source electrode, the first gate electrode, the first drain electrode, the second drain electrode, the second gate electrode, and the second source electrode.

11. The thin film transistor substrate of claim 1, wherein the second drain electrode is disconnected from the first drain electrode.

12. An organic light emitting display apparatus, comprising:
a substrate;
a gate line disposed on the substrate and including a first gate electrode and a second gate electrode;
a gate insulating layer disposed on the first gate electrode and the second gate electrode;
a first semiconductor and a second semiconductor disposed on the gate insulating layer, and overlapping the first gate electrode and the second gate electrode, respectively;
a first source electrode and a first drain electrode disposed on the first semiconductor, and positioned opposed to and spaced apart from each other;
a second source electrode connected to the first drain electrode;
a second drain electrode positioned opposed to and spaced apart from the second source electrode;
a driving transistor electrically connected to the second drain electrode; and
a pixel electrode electrically connected to the driving transistor,
wherein the second source electrode and the second drain electrode are disposed on the second semiconductor, wherein the second drain electrode is positioned on the substrate adjacent the first drain electrode and between the second source electrode and the first drain electrode; and
wherein both the first gate electrode and the second gate electrode are directly connected to the gate line.

13. The organic light emitting display apparatus of claim 12, wherein a positional relationship of the first source electrode and the first drain electrode with respect to the first gate electrode is opposite to a positional relationship of the second source electrode and the second drain electrode with respect to the second gate electrode.

14. The organic light emitting display apparatus of claim 13, wherein the first and second gate electrodes, the first and second source electrodes, and the first and second drain electrodes are positioned along the substrate in the order of the first source electrode, the first gate electrode, the first drain electrode, the second drain electrode, the second gate electrode, and the second source electrode.

15. The organic light emitting display apparatus of claim 12, wherein the second drain electrode is disconnected from the first drain electrode.

* * * * *